United States Patent
Han et al.

(10) Patent No.: US 11,056,704 B2
(45) Date of Patent: Jul. 6, 2021

(54) HYBRID ACTIVE MATERIAL STRUCTURES FOR ELECTROCHEMICAL CELLS

(71) Applicant: GRU Energy Lab Inc., San Jose, CA (US)

(72) Inventors: Song Han, Foster City, CA (US); Sa Zhou, San Jose, CA (US)

(73) Assignee: GRU ENERGY LAB INC., San Jose, CA (US)

( * ) Notice: Subject to any disclaimer, the term of this patent is extended or adjusted under 35 U.S.C. 154(b) by 158 days.

(21) Appl. No.: 16/514,950

(22) Filed: Jul. 17, 2019

(65) Prior Publication Data

US 2020/0036030 A1    Jan. 30, 2020

Related U.S. Application Data

(60) Provisional application No. 62/703,045, filed on Jul. 25, 2018.

(51) Int. Cl.
*H01M 8/18* (2006.01)
*H01M 10/0566* (2010.01)
(Continued)

(52) U.S. Cl.
CPC .......... *H01M 8/184* (2013.01); *H01G 11/32* (2013.01); *H01L 21/28556* (2013.01);
(Continued)

(58) Field of Classification Search
CPC ............ H01M 4/04; H01M 4/12; H01M 8/18
See application file for complete search history.

(56) References Cited

U.S. PATENT DOCUMENTS

| | | | | |
|---|---|---|---|---|
| 2005/0084758 A1* | 4/2005 | Yamamoto | ............ | H01M 4/366 429/231.4 |
| 2005/0089757 A1* | 4/2005 | Bannai | .............. | H01M 10/0525 429/231.8 |

(Continued)

OTHER PUBLICATIONS

Taylor, Rebecca, "From Striped Toothpaste to Lithium-Ion Batteries", Apr. 30, 2013. Retrieved online on Mar. 25, 2021 from: https://www.enterpriseai.news/2013/04/30/from_striped_toothpaste_to_lithium-ion_batteries/.*

*Primary Examiner* — Kenneth J Douyette
(74) *Attorney, Agent, or Firm* — Kwan & Olynick LLP

(57) ABSTRACT

Provided are hybrid active material structures for use in electrodes of electrochemical cells and methods of forming these structures. A hybrid active material structure comprises at least one first substructure and at least one second substructures, each comprising a different layered active material and interfacing each other. Combining multiple layered active materials into the same structure and arranging these materials in specific ways allow achieving synergetic effects of their desirable characteristics. For example, a layered active material, which forms a stable solid electrolyte interface (SEI) layer, may be form an outer shell of a hybrid active material structure and interface with electrolyte. This shell may surround another layered active material, which has a higher capacity but would otherwise forma a less stable SEI layer. Furthermore, multiple layered active materials may be arranged into a stack, in which one of these materials may operate as an ionic and/or electronic conductor.

20 Claims, 5 Drawing Sheets

(51) Int. Cl.
    *H01G 11/32*     (2013.01)
    *H01L 21/285*     (2006.01)
    *H01M 10/0562*     (2010.01)
    *H01M 10/0565*     (2010.01)

(52) U.S. Cl.
    CPC .... *H01M 10/0562* (2013.01); *H01M 10/0565* (2013.01); *H01M 10/0566* (2013.01)

(56) References Cited

U.S. PATENT DOCUMENTS

| | | | | |
|---|---|---|---|---|
| 2012/0107684 A1* | 5/2012 | Iwamoto | ............... | H01M 4/667 |
| | | | | 429/211 |
| 2014/0295268 A1* | 10/2014 | Wang | .................... | H01M 4/366 |
| | | | | 429/218.1 |
| 2015/0349370 A1* | 12/2015 | Snyder | .................. | H01M 50/54 |
| | | | | 429/152 |

* cited by examiner

HYBRID ACTIVE MATERIAL STRUCTURES FOR ELECTROCHEMICAL CELLS

CROSS-REFERENCE TO RELATED APPLICATIONS

This application claims the benefit under 35 U.S.C. § 119(e) of U.S. Provisional Patent Application No. 62/703,045, entitled: "Hybrid Active Material Structures for Electrochemical Cells", filed on 2018 Jul. 25, which is incorporated herein by reference in its entirety for all purposes.

TECHNICAL FIELD

The present disclosure relates generally to hybrid active material structures for electrochemical cells or more specifically for use in electrodes of these cells. The disclosure also relates to electrodes and electrochemical cells as well as methods of forming such structures, electrodes, and cells. More specifically, the present disclosure relates to hybrid active material structures, each comprising multiple layered active materials.

BACKGROUND

High-capacity rechargeable batteries with long cycle lives are highly desirable for various applications. Yet, the capacity increase usually corresponds to the cycle-life reduction, and vice versa. This capacity vs. cycle-life is a common tradeoff in the battery design. One design aspect is selection of active materials for electrodes of rechargeable batteries. In general, active materials can be divided into two categories based on their ion insertion and release mechanisms: layered active materials and non-layered active materials. Layered active materials allow insertion and extractions of ions between adjacent layers of these materials, which results in minimal impact to the host structure of each layer and produces long cycle lives in electrochemical cells using these materials. On the other hand, non-layered materials experience significant structural changes during insertion and extractions of ions, e.g., corresponding to alloying and other like mechanisms. While initial capacities (ability to receive ions) of non-layered materials can be much higher than that of layered materials, the layered materials tend to deteriorate quickly because of the above-mentioned structural changing, resulting in poor cycle life.

What is needed are new structures formed from layered active materials with improved capacities and long cycle life capabilities.

SUMMARY

Provided are hybrid active material structures for use in electrodes of electrochemical cells and methods of forming these structures. A hybrid active material structure comprises at least one first substructure and at least one second substructure, each comprising a different layered active material and interfacing each other. Combining multiple layered active materials into the same structure and arranging these materials in specific ways allow achieving synergetic effects of their desirable characteristics. For example, a layered active material, which forms a stable solid electrolyte interface (SEI) layer, may be form an outer shell of a hybrid active material structure and interface with electrolyte. This shell may surround another layered active material, which has a higher capacity but would otherwise form a less stable SEI layer. Furthermore, multiple layered active materials may be arranged into a stack, in which one of these materials may operate as an ionic and/or electronic conductor.

Provided is a hybrid active material structure for use in an electrode of an electrochemical cell. In some examples, the hybrid active material structure comprises one or more first substructures, comprising a first layered active material. The hybrid active material structure also comprises one or more second substructures, comprising a second layered active material. The composition of the first layered active material is different from the composition of the second layered active material. The one or more first substructures interface and are attached to the one or more second substructures.

In some examples, each of the first layered active material and the second layered active material comprises a common element, such as sulfur, selenium, and/or oxygen. In some examples, one of the first layered active material or the second layered active material comprises a material selected from the group consisting of graphite, $WS_2$, $MoS_2$, BN, $V_2O_{5-x}$, $NiCl_2$, $NbS_2$, $ZrS_2$, $TiSi_2$, $MoSe_2$, $SnS_2$, $VS_2$, $HfS_2$, $WSe_2$, $TiO_2$, and $Li_4Ti_5O_{12}$, and $TiS_2$. For example, the first layered active material comprises graphite, and wherein the second layered active material comprises $TiSi_2$.

In some examples, the weight ratio of the first layered active material in the hybrid active material structure is between about 0.5% and 99.5% or, more specifically, between about 5% and 95% or even between about 20% and 80%. In the same or other examples, the weight ratio of the first layered active material to the second layered active material is between 0.1 and 10 or, more specifically, between 0.2 and 5 or even between 0.5 and 2.

In some examples, the first layered active material of the one or more first substructures is chemically bonded to the second layered active material of the one or more second substructures.

In some examples, the one or more second substructures form a shell, at least partially enclosing the one or more first substructures. More specifically, the shell formed by the one or more second substructures fully encloses the one or more first substructures. In the one or more first substructures and the one or more second substructures are arranged as alternating layers. The thickness of each one of the alternating layers may be between about 1 nanometer and 5 micrometers.

In some examples, at least one of the first layered material or the second layered material has a shape of a particle, a wire, a tube, a net, a sheet, a flake, a needle, a sphere, a belt, a hollow structure, a core-shell, or a york-shell.

In some examples, the surface of the hybrid active material structure is formed predominantly by the one or more first substructures. More specifically, the surface of the hybrid active material structure is formed entirely by the one or more first substructures. Alternatively, the hybrid active material structure further comprises an external surface layer coating disposed over the one or more first substructures and the one or more second substructures and forming a surface of the hybrid active material structure. In some examples, the hybrid active material structure further comprises an interface layer, disposed between the one or more first substructures and the one or more second substructures.

In some examples, at least one of the one or more first substructures and the one or more second substructures comprise a dopant. The hybrid active material structure may be operable as an active material of the electrode, a conductive additive of the electrode, or both.

Provided also is an electrochemical cell, comprising a first electrode, which comprises a hybrid active material structure. The hybrid active material structure comprises one or more first substructures, comprising a first layered active material. The hybrid active material structure also comprises one or more second substructures, comprising a second layered active material. The composition of the first layered active material is different from composition of the second layered active material. The one or more first substructures directly interface the one or more second substructures. The surface of the hybrid active material structure is formed predominantly by the one or more first substructures.

Provided also is a method of forming a hybrid active material structure for use in an electrode of an electrochemical cell. The method comprises forming one or more first substructures, comprising a first layered active material. The method also comprises forming one or more second substructures, comprising a second layered active material. The one or more second substructures are formed over the one or more first substructures. The method comprises forming the one or more first layered structures or forming the one or more second layered structures uses a technique selected from the group consisting of thermal chemical vapor deposition (CVD), plasmas-enhanced CVD, hot-wire CVD, metal organic CVD, microwave CVD, sputtering, thermal evaporation, e-beam evaporation, solid-state reaction, sol-gel method, atomic layer deposition (ALD), hydro-thermal reaction, and co-precipitation.

DETAILED DESCRIPTION

Figure 1A:
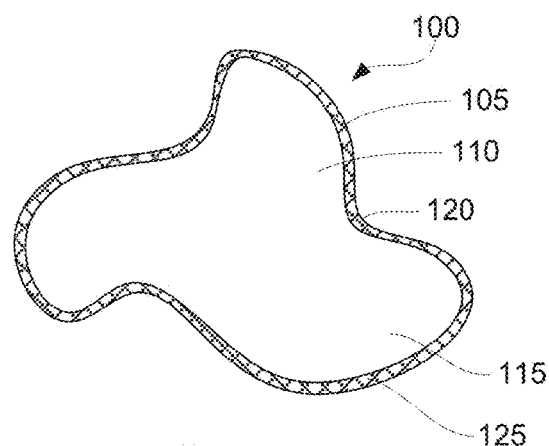
FIGS. 1A-1E are examples of a hybrid active material structure, showing different arrangements of first substructures and second substructures in the hybrid active material structure.

In the following description, numerous specific details are set forth in order to provide a thorough understanding of the present invention. The present invention may be practiced without some or all of these specific details. In other instances, well known process operations have not been described in details to avoid obscuring the present invention. While the invention will be described in conjunction with the specific examples, it will be understood that it is not intended to limit the invention to the examples.

INTRODUCTION

A layered active material is a category of active materials used in rechargeable electrochemical cells, in which atoms (or other building blocks) form multiple repeated layers. Bonds within each layer of a layered material may be different from bonds between layers. For examples, graphite has carbon-carbon SP2 bonds within its layers and Van der Waals bonds between its layers. Furthermore, composition may vary throughout a layered active material. For example, $TiS_2$ has periodic titanium layers, having a crystalline structure and alternating with sulfur layers. Another aspect of layered active materials is the structural geometry of their layers. Each layer of layered active materials may be two-dimensional, e.g., graphene sheets in graphite. In other examples, each layer is a lattice plane, e.g., $WS_2$, $TiS_2$, $SnSe_2$, $GeTe_2$, $V_2O_5$, $MoO_3$, and the like. Furthermore, a mixture of two-dimensional layer and a lattice plane layer, e.g., graphite and C49 $TiSi_2$, may be used.

Distinct and robust layers of these materials allow insertion and removal of ions during cycling of rechargeable electrochemical cells without disturbing these layers, which results in excellent cycle of the cells built with layered active materials. Specifically, layered materials are operable to receive and release ions between their adjacent layers. These ions do not go into the layers, and the bonds between atoms or other building blocks in each layer remain intact. In other words, a local host structure of each layer is retained during cycling. However, conventional layered active materials have small capacities, e.g., graphite has a theoretical capacity of 372 mAh/g. Higher capacity layered materials, such as $V_2O_5$, $GeP_5$, and SnSe, have not been adopted because of various other problems, e.g., unstable interfaces with electrolytes and higher electrochemical potentials.

Layered active materials are different from non-layered active materials based on their structural characteristics as well as operating characteristics. In particular, non-layered active materials may be homogeneous and may have uniform structure (e.g., crystalline structure) in all dimensions and throughout the entire volume of a structure formed from a non-layered active material. Furthermore, non-layered active materials have different mechanisms of receiving and releasing ions, such as alloying. For example, when lithium ions are driven to silicon structures, lithium forms strong bonds with silicon and break pre-exist bonds, e.g., silicon-silicon. This disruption of bonds and original structures in non-layered active materials during insertion and removal of ions translates in poor cycle life. Some examples of non-layered active materials include, but are not limited to silicon (Si), Si-alloys, tin (Sn), tin oxide ($SnO_2$), germanium (Ge), Li metal, $Li_2TiO_3$, $Li_{3-x}M_xN$ (wherein M=Mn, Cu, Ni, Co, Fe), $Li_{2n-1}MN_n$ (where M=Sc, Ti, V, Cr, Mn, Fe), and the like.

While various attempts have been made to combine layered active materials and non-layered active materials, the deficiency of non-layered active materials (i.e., poor cycle life) remain in these combinations. Furthermore, attempts to combine multiple layered active materials in the same battery electrode have been proposed. However, these attempts have focused on introducing each layered active material in the form of discrete structures (e.g., particles or flakes). For example, powders of two or more layered active materials are combined together with a polymer binder into slurry, which is then deposited and dried into an electrode layer. While the formed electrode layer comprises these layered active materials, the layered active materials structures are not integrated and simply supported by a polymer binder. For example, one layered active material structure is not able to block electrolyte from contacting another layered active material structure. Furthermore, there are often no direct electrical connections between layered active material structures. Instead the connections are provided through intermediate structures, such as conductive additives.

As a result, each layered active material is fully exposed to electrolyte. Furthermore, each layered active material operates in its own charge-discharge regime due to the lack of direct electrical coupling between these discrete structures. The electrical conductivity between structures of different layered active materials in the same electrode may be limited and substantially less than when these materials are integrated into the same structure.

Provided are novels ways of combining different layered active materials into hybrid active material structures. Specifically, a hybrid active material structure comprises one or more first substructures, comprising a first layered active material, and one or more second substructures, comprising a second layered active material. The composition of the first layered active material is different from the composition of the second layered active material. Furthermore, the one or more first substructures directly interface and attached to the one or more second substructures, within the hybrid active material structure. In other words, the one or more first substructures and the one or more second substructures are integrated together into the hybrid active material structure, prior to introducing this hybrid active material structure into slurry and forming an electrode. In some examples, graphite is used as a substrate to grow $WS_2$, $TiS_2$, $TiSi_2$, and other materials listed in this disclosure, using, e.g., chemical vapor deposition (CVD). In some examples, carbon is coated on a substrate comprising $GeP_5$, $V_2O_5$, and/or SnSe, using sol-gel methods or high temperate decomposition of carbon precursors or liquid phase surface coating etc. This approach is very different from combining structures of different layered active materials in slurry, as described above. In this later approach, structures of each layered active materials are fully exposed to the electrolyte. Furthermore, there is no direct electrical contact between structures of different layered active materials. Finally, structures of different layered active materials are randomly (e.g., uniformly) distributed throughout the electrode.

Integration of different layered active materials into the same hybrid active material structure in a controllable manner allows achieving various synergistic effects, such as exploiting beneficial characteristic of each layered active material while preventing its negative characteristics from taking effect. For example, many current electrolytes used in lithium ion batteries have been developed to form stable SEI layers on graphite surface, in order to provide stable and long cycling life. Introducing another layered active material, which does not form stable SEI layers with these electrolytes, in a form of a separate structure or on a surface of a hybrid structure, may render either one these structures unsuitable for these electrolytes. Specifically, titanium silicide ($TiSi_2$) has a much high capacity than graphite first layered active material (900 mAh/g vs. 370 mAh/g) but does not form a stable SEI layer. As such, titanium silicide cannot be used with many conventional electrolytes. However, when titanium silicide is covered with graphite, e.g., the surface of a hybrid structure is formed by graphite, these electrolytes may be used. In other words, graphite may form at least a partial shell around another titanium silicide structure (or a structure formed from any other layered materials) in a hybrid structure.

Integration of different layered active materials into the same hybrid active material structure allows using new layered materials that were otherwise not suitable for use in electrodes, at least in the form of separate stand-alone structures. Some examples of these new materials are various forms of sulfides and silicides (e.g., $TiS_2$, TiSi, $WS_2$, etc.). Some of these layered materials may be referred to as high capacity layered active materials, which are defined as materials with a theoretical capacity of at least about 500 mAh/g. Furthermore, some layered active materials may be referred as highly conductive layered active materials, which are defined as materials with a conductivity of at least about $10^{-2}$ S/m. In some examples, a high capacity layered active material may be combined with a highly conductive layered active material to form hybrid active material structure. However, other combinations are also within the scope.

Examples of Hybrid Active Material Structures

FIGS. 1A-1E illustrate various examples of hybrid active material structure 100. As further described below, hybrid active material structure 100 may be used in an electrode of an electrochemical cell, various examples of which are described below with reference to FIGS. 4A and 4B. Hybrid active material structure 100 comprises one or more first substructures 110 and one or more second substructures 120. First substructures 110 comprise first layered active material 115, while second substructures 120 comprise second layered active material 125. The composition of first layered active material 115 is different from the composition of second layered active material 125.

Figure 1B:
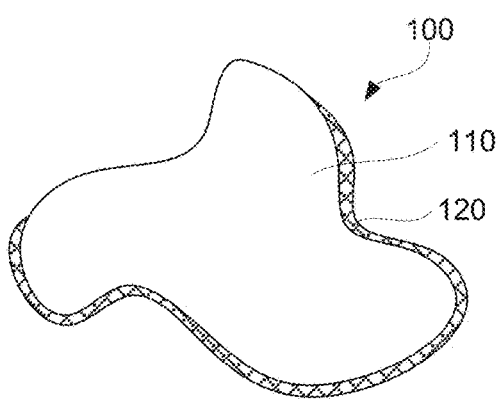
Figure 1C:
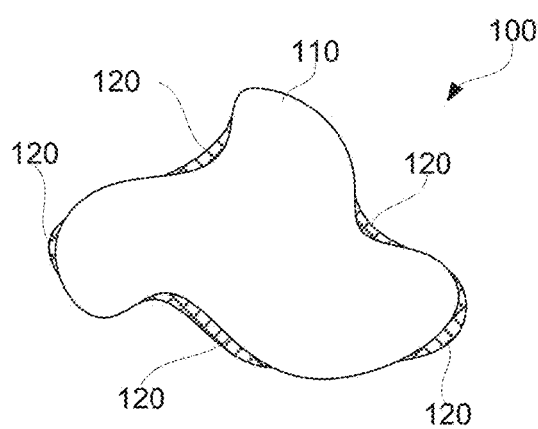
Figure 1D:
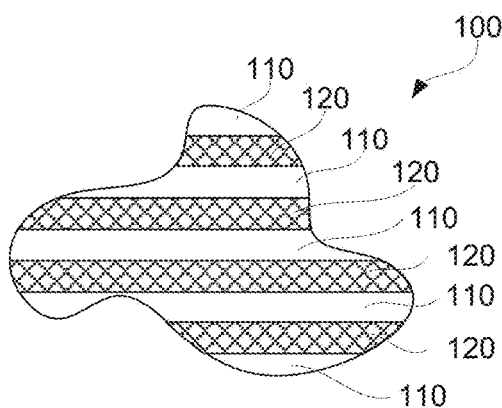
Figure 1E:
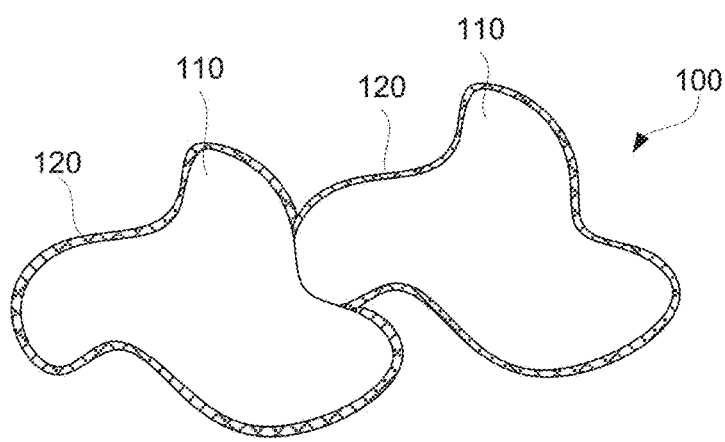

One or more first substructures 110 may be a single monolithic component, as for example shown in FIGS. 1A-1C. Alternatively, one or more first substructures 110, of the same hybrid active material structure 100, may be multiple components. For example, FIG. 1D illustrates five first substructures 110, which are disjoined and stacked together with second substructures 120. FIG. 1E illustrates another example in which two first substructures 110 have a common interface but don't form a single monolithic component. Similarly, one or more second substructures 120 may be a single monolithic component, as for example shown in FIGS. 1A-1B. Alternatively, one or more second substructures 120, of the same hybrid active material structure 100, may be multiple components, e.g., disjoined as shown in FIGS. 1C and 1D, or interfacing each other. Regardless of the number of first substructures 110 and second substructures 120 in hybrid active material structure 100, all substructures of the same hybrid active material structure 100 are attached together.

Overall, one or more first substructures 110 directly interface and are attached to one or more second substructures 120. In some examples, each of first substructures 110 directly interfaces and is attached to at least one of second substructures 120. In more specific examples, this first substructure 110 may also directly interface and may be attached to one or more other first substructures 110 as, for example, shown in FIG. 1E. Similarly, in some examples, each of second substructures 120 directly interfaces and is attached to at least one of first substructures 110. In more specific examples, this second substructure 120 may also directly interface and may be attached to one or more other second substructures 120. Overall, this interfacing and connections between first substructures 110 and second substructures 120 allows for ions to move faster and more reliably within hybrid active material structure 100 than, for example, when layered active material structures are first combined in a slurry and may be separated in a resulting electrode layer.

FIGS. 1A and 1B illustrate an example of hybrid active material structure 100, in which first substructure 110 forms a core, while second substructure 120 forms a shell, fully or partially enclosing the core. This type of hybrid active material structure 100 may be used in one or more of the following examples: (a) first layered active material 115 of first substructure 110 may need to be at least partially separated from electrolyte; (2) second substructure 120 provides stronger adhesion to a binder used in electrode: (3) second substructure 120 provides better electronic and ionic pathways to the core as well as to the electrode (e.g., to other hybrid active material structures, current collector, and/or electrolyte).

When second substructure 120 fully encloses first substructure 110, as, for example, shown in FIGS. 1A and 1E, no parts of first substructure 110 is exposed. Second substructure 120 may form external surface 105 of hybrid active material structure 100 as, for example, shown in FIG. 1A. Alternatively, another layer may be disposed over second substructure 120, as further described above.

In some examples, second substructure 120 only partially encloses first substructure 110 as for example shown in FIG. 1B. Other examples are shown in FIGS. 1C and 1D. A portion of the surface area of first substructure 110 not covered by any of second substructures 120 may be between about 1% and 99% or, more specifically between 20% and 80%.

FIG. 1D illustrates an example of hybrid active material structure 100, in which first substructures 110 and second substructures 120 are arranged into alternating layers. The thickness of each one of the alternating layers is between about 1 nanometers and 3 micrometers or, more specifically, between 10 nanometers and 500 nanometers. Hybrid active material structure 100 of this example by alternating depositions of first substructures 110 and second substructures 120, e.g., alternating cycles of sputtering, chemical vapor deposition (CVD), atomic layer deposition (ALD), or other deposition techniques. This type of hybrid active material structure 100 may be used when one type of substructures provide superior ionic and/or electronic conductivity than the other type.

Each of first substructures 110 and second substructures 120 as well as hybrid active material structure 100 may take various shapes, such as a particle, a wire, a tube, a net, a sheet, a conformal layer, a flake, a needle, a sphere, a belt, a hollow structure, a core-shell, or a york-shell. Particles and spheres are examples of a three-dimensional object in which a ratio of any two dimensions is less than 10. Sheets and flakes are examples of a two-dimensional object in which a ratio of one dimension (thickness) to any one of the remaining two dimensions is less than 10. Finally, needles, wires, and tubes are examples of a one-dimensional object in which a ratio of one dimension (length) to any one of the remaining two dimensions is greater than 10. Three-dimensional objects may have the lowest surface area to volume ratio and may be used when the surface area needs to be minimized. Two-dimensional objects may be used as shells for other objects, provide in-plane ionic and/or electronic conductivity, and the like. One-dimensional objects may be used to provide is ionic and/or electronic conductivity along a particular dimension, e.g., away from a current collector and in some examples may contact the current collector (e.g., be substrate rooted).

The principal dimension (e.g., a diameter for a sphere-shaped particle) of hybrid active material structure 100 may be 1 nanometers and 20 nanometers, 1 nanometers and 100 nanometers, 1 nanometers and 500 nanometers, 1 nanometers and 1000 nanometers, 1 micrometers and 10 micrometers, 1 micrometers and 30 micrometers, 100 nanometers and 500 nanometers, and 100 nanometers and 5000 nanometers. Furthermore, the dimension of each of first substructures 110 and second substructures 120 may be 1 nanometers and 20 nanometers, 1 nanometers and 100 nanometers, 1 nanometers and 500 nanometers, 1 nanometers and 1000 nanometers, 1 micrometers and 10 micrometers, 1 micrometers and 30 micrometers, 100 nanometers and 500 nanometers, and 100 nanometers and 5000 nanometers.

As stated above, both first substructures 110 and second substructures 120 comprise layered active materials. Some examples include but are not limited to graphite, graphene, $WS_2$, $MoS_2$, BN, $V_2O_{5-x}$ (where X is between or equal to 0 and 3), $NbS_2$, $ZrS_2$, $TiSi_2$, $TiS_2$, $MoSe_2$, $SnS_2$, $VS_2$, $HfS_2$, $WSe_2$, $MoO_3$, SnS, SiSe, GeSe, GeS, SnSe, BP, $GeP_5$, $C_3N_4$. Lithiated variations of the above-listed materials are also within the scope.

More specifically, one or more first substructures 110 comprise first layered active material 115, while one or more second substructures 120 comprise second layered active material 125. The composition of first layered active material 115 is different from the composition of second layered active material 125. For example, first layered active material 115 may be $TiSi_2$, while second layered active material 125 may be graphite. Graphite provides a good interface with most common electrolytes, but it also has a low capacity and poor conductivity. On the other hand, $TiSi_2$ has a better conductivity and capacity than graphite but forms a less stable SEI layer with standard electrolytes. Combining graphite and $TiSi_2$ in the same hybrid active material structure 100 allows using graphite to block $TiSi_2$ from electrolytes, while still relying on the high conductivity and capacity of $TiSi_2$.

In another example, first layered active material 115 may be $V_2O_5$, while second layered active material 125 may be graphite. In this case, graphite not only forms a stable SEI layer, but graphite also provides better interface electric contact (e.g., to other hybrid active material structures in the electrode) since $V_2O_5$ has a low conductivity. At the same time, $V_2O_5$ has a much higher capacity than graphite.

In general various characteristics of layered active materials are considered while designing hybrid active material structure 100. Some examples of these characteristics are lattice spacing, electronic conductivity, ionic conductivity, capacity, SEI layer formation characteristics, and potential versus lithium. Arranging different active layered materials in various manners in the same hybrid active material structure 100 allows achieving synergistic effects of desirable characteristics of each material while masking its less desirable characteristics.

In some examples, a weight ratio of first layered active material 115 in hybrid active material structure 100 is between about 0.1% and 99.9% or, more specifically, between 1% and 97%, between 5% and 95%, between 10% and 90%, between 20% and 80%, or between 30% and 70%. The rest may be second layered active material 125. In some examples, a weight ration of first layered active material 115 to second layered active material 125 is between 0.1 and 10 or more specifically between 0.2 and 5, between 0.3 and 3, between 0.5 and 2, or between 0.6 and 1.5.

In some examples, hybrid active material structure 100 comprises one or more dopants. These dopants may be incorporated into one or more first substructures 110, one or more second substructures 120, or both (e.g., during fabrication of these structures). The concentration of the dopant may be between about 0.001% molar and 2% molar. Some examples of suitable dopants include, but are not limited to, Ni, Cu, Ti, and the like. These dopants can help to reduce structure change during the ion transfer process. They can also help to improve the conductivity of layered materials and help with ionic transport within these materials.

In some examples, each of first layered active material 115 and second layered active material 125 comprises a common element, such as sulfur, selenide, and/or oxygen. For example, second substructures 120 cannot be deposited on first substructures 110. In these examples, first layered active material 115 of first substructures 110 may be partially used to convert into second layered active material 125, while forming second substructures 120 over first substructures 110. In this example, one or more first substructures 110 may be chemically bonded to one or more second substructures 120 in hybrid active material structure 100. Furthermore, having a common element improves adhesion between first substructures 110 and second layered active material 125 to improve the mechanical stability of hybrid active material structure 100.

Figure 2A:
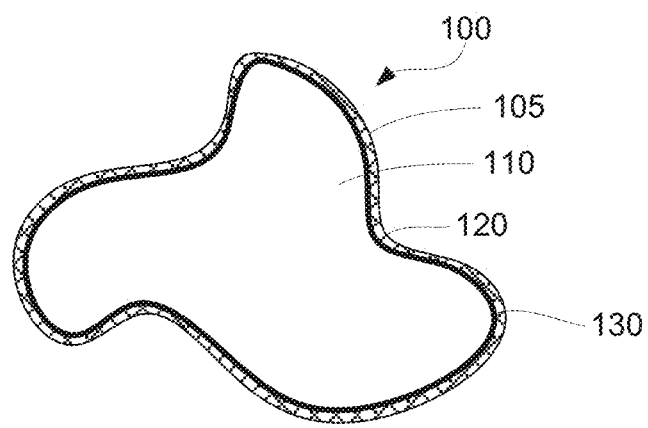
FIG. 2A is an example of a hybrid active material structure, showing an adhesion promotion layer.

In some examples, adhesion between one or more first substructures 110 and one or more second substructures 120 may be enhanced by surface treating one or both of first substructures 110 and second substructures 120. More specifically, interface layer 130 may be disposed between first substructures 110 and/or second substructures 120 as, for example, shown in FIG. 2A. Interface layer 130 may be used for adhesion promotion and/or the other purposes. Interface layer 130 may comprise an oxide or, more specifically, $SiO_2$, $Al_2O_3$, $TiO_2$, Cu (metal), W (metal), Ti (metal). Ni (metal), carbon, and/or silicon. While forming hybrid active material structure 100, interface layer 130 may be deposited on first substructures 110 prior to adding second substructures 120. For example, interface layer 130, e.g., comprising $Al_2O_3$, may be formed on the surface of first substructures 110, e.g., comprising graphite. Interface layer 130 may be formed using atomic layer deposition (ALD), for example. After interface layer 130 is formed, second substructure 120, e.g., comprising graphite, may be formed over interface layer 130. In some examples, interface layer 130 is amorphous or crystalline. Interface layer 130 may be continuous and conformal or in the form of discreet islands.

Figure 2B:
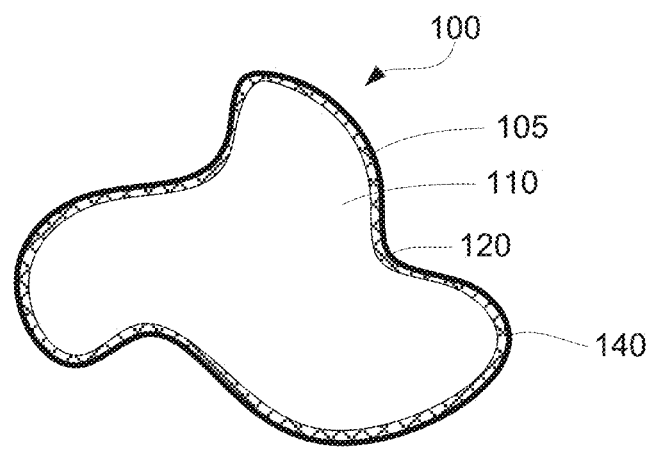
FIG. 2B is an example of a hybrid active material structure, showing an external surface layer.

In some examples, hybrid active material structure 100 comprises external surface layer 140, as for examples shown in FIG. 2B. For example, external surface layer 140 is formed on the surfaces of second substructures 120. External surface layer 140 may comprise carbon, $TiSi_2$ grown on graphite particle surfaces, and the line. In some examples, to protect $TiSi_2$ structures, a thin passivation layer, comprising silicon oxide, is formed on the surface of these $TiSi_2$ structures. Alternatively, hybrid active material structure 100 does not include external surface layer 140 and second substructures 120 are exposed.

Example of Fabricating Hybrid Active Material Structures

Figure 3:
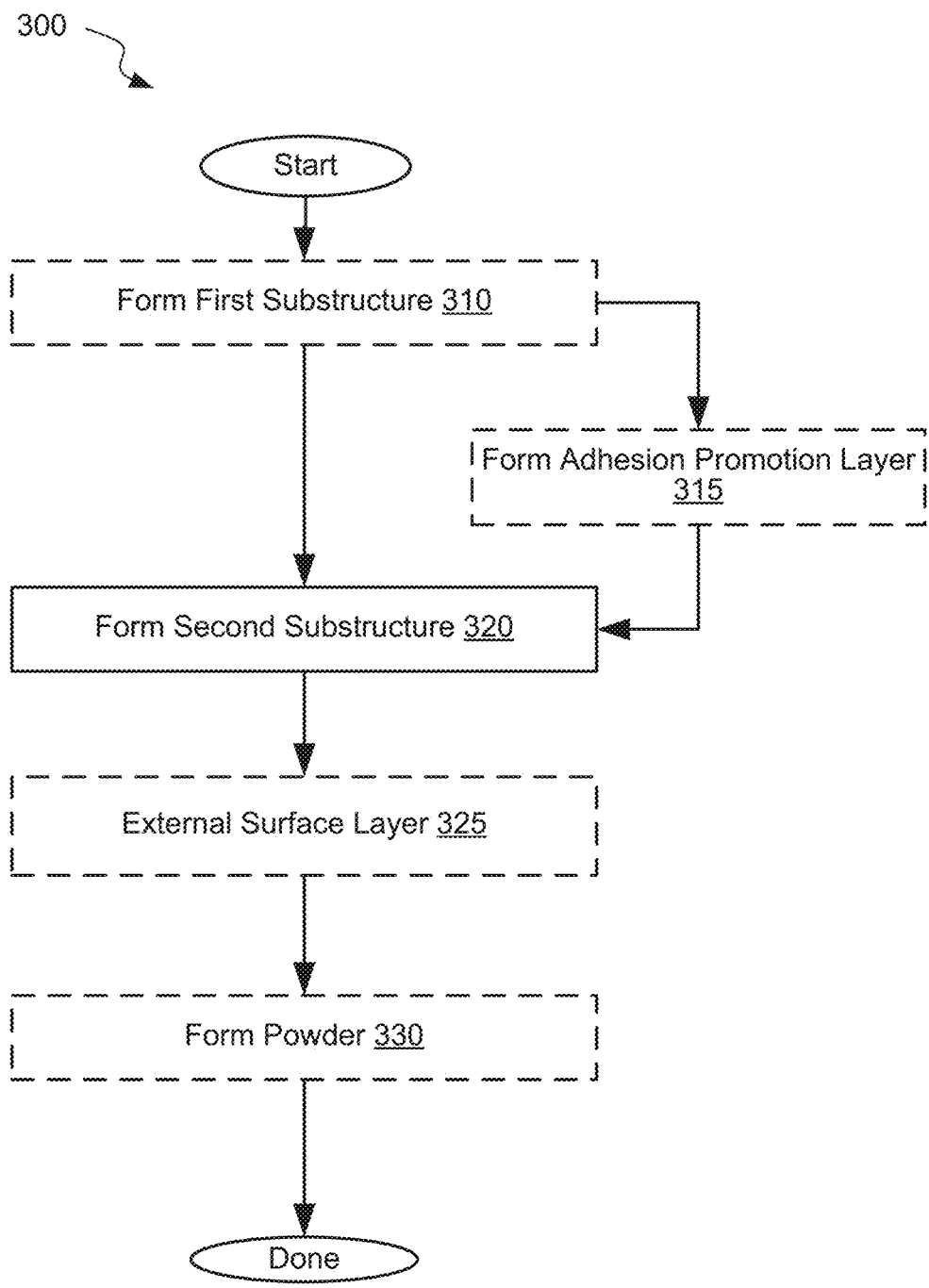
FIG. 3 is a process flowchart corresponding to a method of fabricating hybrid active material structures, in accordance with some examples.

FIG. 3 is a process flowchart corresponding to method 300 of forming hybrid active material structures 100, in accordance with some examples. Various examples of hybrid active material structures 100 are described above.

Method 300 may commence with forming first substructures 110 during optional operation 310. This operation may involve one or more of thermal CVD, plasmas-enhanced CVD, hot-wire CVD, metal-organic CVD, microwave CVD, sputtering, thermal evaporation, e-beam evaporation, solid-state reaction, sol-gel method. ALD, hydro-thermal reaction, ARC furnace and co-precipitation, and the like. Deposition may be performed on a temporary substrate, fluidized bed reaction, and the like. For example, $TiSi_2$ structures are first formed using CVD. A $V_2O_5$ is then coated on $TiSi_2$ structures using, for example, a sol-gel process followed by a high temperature annealing.

Alternatively, first substructures 110 may be provided to method 300 in a premade form. For example, $TiS_2$ powder may be supplied without executing operation 310. Examples of other first layered active materials 115 are described above.

In some examples, method 300 further comprises forming interface layer 130 during optional operation 315, which may involve one or more of thermal CVD, plasmas-enhanced CVD, hot-wire CVD, metal-organic CVD, microwave CVD, sputtering, thermal evaporation, e-beam evaporation, solid-state reaction, sol-gel method, ALD, hydro-thermal reaction, ARC furnace and co-precipitation, and the like. Various examples of interface layer 130 are described above. Interface layer 130 may be formed on surface of first substructures 110 prior to forming second substructures 120. For example, $TiSi_2$ structures may not be directly formed on ZrS. Instead, a layer of Ti (metal) may be first deposited on ZrS via sputtering first to function as an adhesion layer. $TiSi_2$ is then deposited on the formed Ti layer. In some examples, hybrid active material structure 100 does not include interface layer 130 and operation 315 is not performed. Furthermore, first substructures 110 may be supplied with interface layer 130 already formed on their surfaces.

Method 300 also comprises forming second substructures 120 during operation 320, which may involve one or more of thermal CVD, plasmas-enhanced CVD, hot-wire CVD, metal-organic CVD, microwave CVD, sputtering, thermal evaporation, e-beam evaporation, solid-state reaction, sol-gel method, ALD, hydro-thermal reaction, ARC furnace and co-precipitation, and the like. For example, conformal carbon coating may be applied on surface of $TiSi_2$, GeS, and/or SnS, and the like, using a thermal CVD process. Various examples of second substructures 120 are described above. Second substructures 120 may be formed directly over first substructures 110 and/or over interface layer 130 disposed over first substructures 110.

In some examples, method 300 further comprises forming external surface layer 140 during optional operation 325, which may involve one or more of thermal CVD, plasmas-enhanced CVD, hot-wire CVD, metal-organic CVD, microwave CVD, sputtering, thermal evaporation, e-beam evaporation, solid-state reaction, sol-gel method, ALD, hydro-thermal reaction, ARC furnace and co-precipitation. Various examples of external surface layer 140 are described above. In some examples, graphite is used as a substrate to grow $WS_2$, $TiS_2$, $TiSi_2$ using, for example, chemical vapor deposition. In other examples, carbon is deporsed on $GeP_5$, $V_2O_5$, and/or SnSe using, for example, a sol-gel method or a high temperate decomposition of carbon precursors or liquid phase surface coating. External surface layer 140 is formed on the surfaces of second substructures 120. In some examples, hybrid active material structure 100 does not include external surface layer 140 and operation 325 is not performed.

In some examples, method 300 further comprises forming powder during optional operation 330. For example, a stack including one or more first substructures 110 and one or more second substructures 120 may be in the form of a sheet supported on a temporary substrate. This sheet may be removed from the substrate and formed into the powder for future use in slurry/electrode/electrochemical cell. For example, ball milling, jet-mill, and/or grinding may be used.

Examples of Electrode and Electrochemical Cells/Applications

Figure 4A:
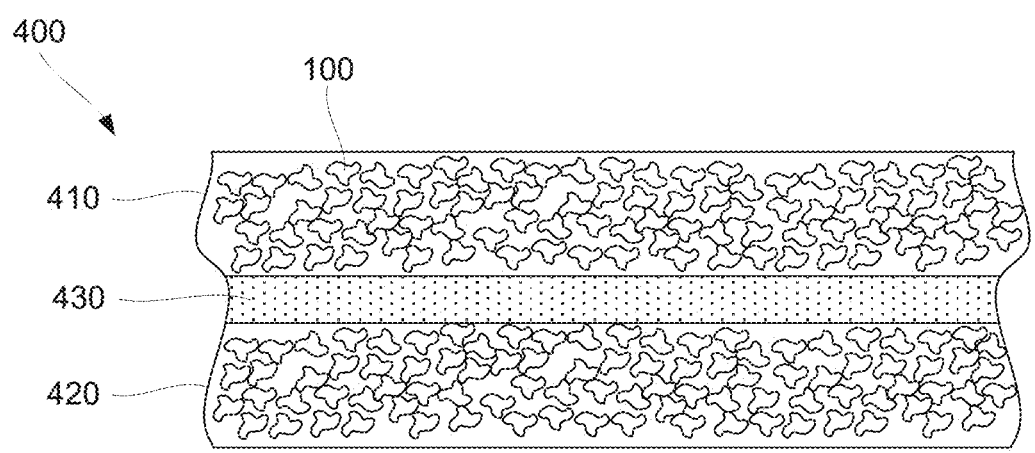
FIG. 4A is a schematic illustration of an electrode, comprising hybrid active material structures, in accordance with some examples.

In some examples, hybrid active material structures, formed using two or more different layered active materials structures, are used in an electrode of an electrochemical cell. FIG. 4A is a schematic illustration of electrode 400, comprising current collector 430, first active layer 410, and, optionally, second active layer 420. In this example, first active layer 410 and second active layer 420 are supported by current collector 430, which also provides electric communication between first active layer 410 and second active layer 420 and other components of the cell. One or both first active layer 410 and second active layer 420 may comprise hybrid active material structures 100. Hybrid active material structures 100 are configured to receive and release ions during cycling of the electrochemical cell. Furthermore, hybrid active material structures 100 may be used as conductive additives. In these examples, first active layer 410 and second active layer 420 comprise other active materials. Furthermore, in these examples, the amount of conventional conductive additives (e.g., Carbon Black, Super P) used in first active layer 410 and second active layer 420 may be reduced or completely eliminated. In some examples, hybrid active material structures are used as ionic sources (e.g., lithium source) to compensate for ionic losses in the cell (e.g., to form an SEI layer). First active layer 410 and second active layer 420 may comprise binder, other active materials, and/or other conductive additives in addition to hybrid active material structures 100.

Figure 4B:
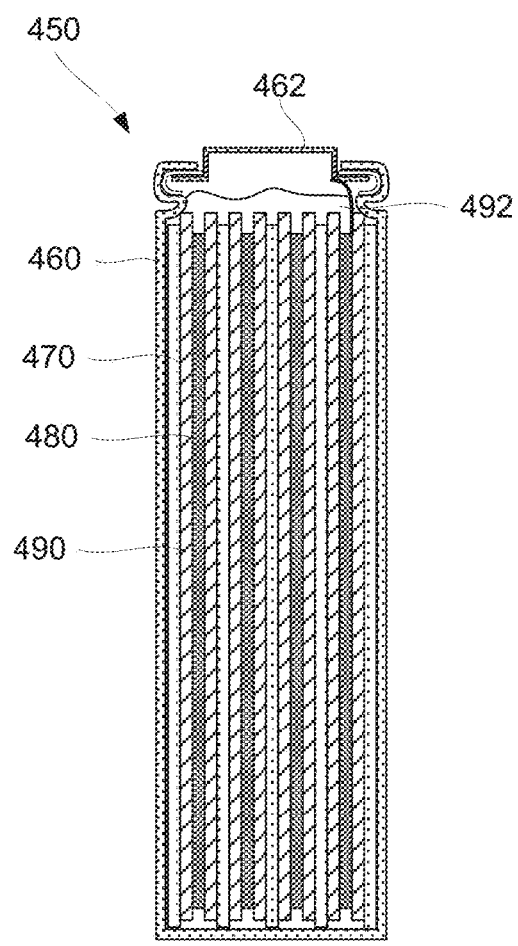
FIG. 4B is a schematic illustration of an electrochemical cell, comprising two electrodes, at least one of which comprises hybrid active material structures, in accordance with some examples.

FIG. 4B is a schematic illustration of electrochemical cell 450, comprising first electrode 470, second electrode 480, and separator 490 arranged in a stack, wound jelly-roll, or any form. First electrode 470, second electrode 480, or both may include hybrid active material structures as described with reference to FIG. 4A above. Separator 490 is disposed between first electrode 470 and second electrode 480 to prevent direct contact between first electrode 470 and second electrode 480 yet allows ionic communication between these electrodes. Specifically, separator 490 may include pores allowing ions to pass. Electrochemical cell 450 also includes electrolyte 492, which operates as a carrier of ions during cycling of electrochemical cell 450. First electrode 470, second electrode 480, and other components of the cell may be enclosed and separated from the environment by case 460 and lid 462. In some examples, case 460 and/or lid 462 may operate as terminals of electrochemical cell 450, in which case current collectors of first electrode 470 and/or second electrode 480 may be connected to case 460 and/or lid 462. Some examples of electrochemical cell 450 include, but are not limited to, lithium ion batteries, lithium polymer batteries, lithium air batteries, lithium sulfite batteries, lithium metal batteries, solid-state batteries, super capacitors, and the like.

In some examples, case 460 is rigid (e.g., the case is a steel can). Other types of cells may be packed into a flexible, foil-type (e.g., polymer laminate) case. The case material selection depends on polarity of case 460 (e.g., neutral, connected to positive electrodes, connected to negative electrodes) as well as the composition of electrolyte, operating potentials of electrochemical cell 450, and other like factors. For example, when case 460 is connected to a positive electrode, case 460 may be formed from titanium, titanium alloys, aluminum, aluminum alloys, and/or stainless steel. On the other hand, if case 460 is connected to a negative electrode, then case 460 may be made from titanium, titanium alloys, copper, nickel, lead, and stainless steels. The electrical connection between case 460 and an electrode may be established by a direct contact between case 460 and this electrode (e.g., an outer wound of the jelly roll), by a tab connected to the electrode and case 460, and other techniques.

The top of case 460 may be open and used for insertion of the electrode assembly (e.g., a jelly roll) and then capped with a header assembly, which may include a weld plate, a rupture membrane, a PTC-based resettable fuse, and an insulating gasket. The insulating gasket is used to support the conductive components of the header assembly and to insulate these components from case 460. In some examples, a PTC-based resettable fuse is disposed between edges of the rupture membrane and edges of the header cup, effectively interconnecting these two components. At normal operating temperatures, the resistance of PTC-based resettable fuse is low. However, its resistance increases substantially when heated. For example, the PTC-based resettable fuse may be a thermally activated circuit breaker that can electrically disconnect the rupture membrane from the header cup.

Types of electrochemical cells are determined by active materials used on positive and negative electrodes as well as composition of electrolyte. Some examples of positive active materials include Li (M'$_x$M"$_y$)O$_2$, where M' and M" are different metals (e.g., Li(Ni$_x$Mn$_y$)O$_2$, Li(Ni$_{1/2}$Mn$_{1/2}$)O$_2$, Li(Cr$_x$Mn$_{1-x}$)O$_2$, Li(Al$_x$Mn$_{1-x}$)O$_2$), Li(Co$_x$M$_{1-x}$)O$_2$, where M is a metal, (e.g., Li(Co$_x$Ni$_{1-x}$)O$_2$ and Li(Co$_x$Fe$_{1-x}$)O$_2$), Li$_{1-W}$(Mn$_x$Ni$_y$Co$_Z$)O$_2$, (e.g., Li(Co$_x$Mn$_y$Ni$_{(1-x-y)}$)O$_2$, Li(Mn$_{1/3}$Ni$_{1/3}$Co$_{1/3}$)O$_2$, Li(Mn$_{1/3}$Ni$_{1/3}$Co$_{1/3}$.xMg$_X$)O$_2$, Li(Mn$_{0.4}$Ni$_{0.4}$Co$_{0.2}$)O$_2$, Li(Mn$_{0.1}$Ni$_{0.1}$Co$_{0.8}$)O$_2$, Li$_{1-W}$(Mn$_X$Ni$_X$Co$_{1-2X}$)O$_2$, Li$_{1-W}$(Mn$_X$Ni$_Y$CoAl$_W$)O$_2$, Li$_{1-W}$(Ni$_X$Co$_Y$Al$_Z$)O$_2$ (e.g., Li(Ni$_{0.8}$Co$_{0.15}$Al$_{0.05}$)O$_2$), Li$_{1-W}$(Ni$_X$Co$_Y$M$_Z$)O$_2$, where M is a metal, Li$_{1-W}$(Ni$_X$Mn$_Y$M$_Z$)O$_2$, where M is a metal. Li(Ni$_{X-Y}$Mn$_Y$Cr$_{2-X}$)O$_4$, LiM'M"$_2$O$_4$, where M' and M" are different metals (e.g., LiMn$_{2-Y-Z}$Ni$_Y$O$_4$, LiMn$_{2-Y-Z}$Ni$_Y$Li$_Z$O$_4$, LiMn$_{1.5}$Ni$_{0.5}$O$_4$, LiNiCuO$_4$, LiMn$_{1-X}$Al$_X$O$_4$, LiNi$_{0.5}$Ti$_{0.5}$O$_4$, Li$_{1.05}$Al$_{0.1}$Mn$_{1.85}$O$_{4-z}$F$_z$, Li$_2$MnO$_3$)Li$_X$V$_Y$O$_Z$, e.g., LiV$_3$O$_8$, LiV$_2$O$_5$, and LiV$_6$O$_{13}$.

Active materials may be deposited in active material layers and supported on conductive substrates. The conductive substrates not only provide mechanical support to the active material layers but also deliver electrical currents between the active material layers and battery terminals. Substrate materials may include copper, stainless steel, titanium, aluminum, nickel, chromium, tungsten, metal nitrides, metal carbides, carbon, carbon fiber, graphite, graphene, or combinations of above including multi-layer structures. Various considerations described above with reference to case materials also apply to substrate materials. In some examples, the substrate is a foil, films, mesh, laminate, or any other suitable configurations.

In some embodiments, a separator is disposed between a positive electrode and an adjacent negative electrode. Some example of separator material include poly(ethylene-co-tetrafluoroethylene (PETFE), poly(ethylenechloro-co-trifluoroethylene), polystyrenes, polyvinyl chlorides polypropylene, polyethylene, polyamides, polyimides, polyacrylics, polyacetals, polycarbonates, polyesters, polyetherimides, polyimides, polyketones, polyphenylene ethers, polyphenylene sulfides, glass fiber materials, ceramics, and a polypropylene membrane.

The electrolyte provides ionic communication between positive and negative electrodes in the cell. The electrolyte may be liquid, solid, or gel. A liquid electrolyte may include one or more solvents and one or more lithium-containing salts. Some solvent examples include cyclic carbonates (e.g., ethylene carbonate (EC), propylene carbonate (PC), butylene carbonate (BC) and vinylethylene carbonate (VEC)), lactones (e.g., gamma-butyrolactone (GBL), gamma-valerolactone (GVL) and alpha-angelica lactone (AGL)), linear carbonates (e.g., dimethyl carbonate (DMC), methyl ethyl carbonate (MEC), diethyl carbonate (DEC), methyl propyl carbonate (MPC), dipropyl carbonate (DPC), methyl butyl carbonate (NBC) and dibutyl carbonate (DBC)), ethers (e.g., tetrahydrofuran (THF), 2-methyltetrahydrofuran, 1,4-dioxane, 1,2-dimethoxyethane (DME), 1,2-diethoxyethane and 1,2-dibutoxyethane), nitriles (e.g., acetonitrile and adiponitrile) linear esters (e.g., methyl propionate, methyl pivalate, butyl pivalate and octyl pivalate), and amides (e.g., dimethyl formamide). Some examples of salts include $LiPF_6$, $LiBF_4$, $LiClO_4$ $LiAsF_6$, $LiN(CF_3SO_2)_2$, $LiN(C_2F_5SO_2)_2$, $LiCF_3SO_3$, $LiC(CF_3SO_2)_3$, $LiPF_4(CF_3)_2$, $LiPF_3(C_2F_5)_3$, $LiPF_3(CF_3)_3$, $LiPF_3(iso-C_3F_7)_3$, $LiPF_5(iso-C_3F_7)$, lithium salts having cyclic alkyl groups (e.g., $(CF_2)_2(SO_2)_{2x}Li$ and $(CF_2)_3(SO_2)_{2x}Li)$, and combination of thereof. The total concentration of one or more salts in the electrolyte is at least about 0.3 M or, more specifically, at least about 0.7M.

Experimental Results

Figure 5:
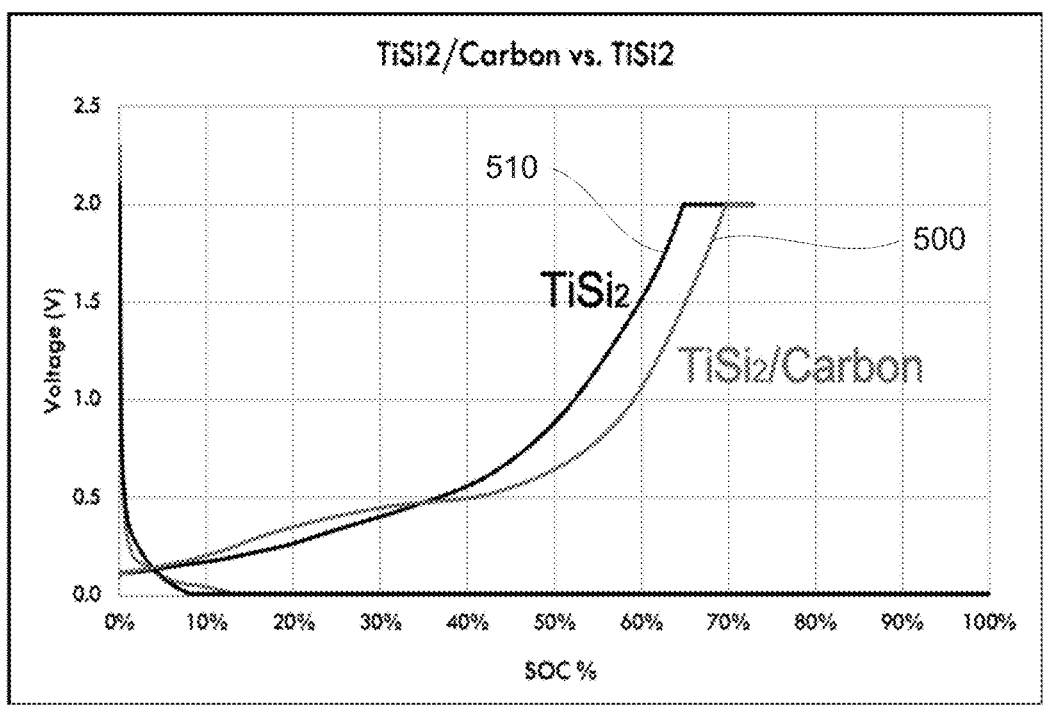
FIG. 5 is a capacity retention plot for an electrochemical cell fabricated using a mixture of layered materials.

An experiment has been conducted to test titanium disilicide ($TiSi_2$) structures with carbon coating (line 510 in FIG. 5) vs. titanium disilicide ($TiSi_2$) structures without carbon coating (line 500 in FIG. 5). The thin carbon film coating was formed on the surface of TiSi2 structures using high temperature carbonization of glucose. C49-TiSi2 includes flat Si-only layers separated by polyhedrons of Ti and Si. Graphite is a layered material with carbon atoms form in planes with hexagonal lattice. By applying a thin layer of carbon, the first cycle efficiency could improve about 5% as shown in FIG. 5.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present examples are to be considered as illustrative and not restrictive.

The invention claimed is:

1. A hybrid active material structure for use in an electrode of an electrochemical cell, the hybrid active material structure comprising:
   one or more first substructures, comprising a first layered active material; and
   one or more second substructures, comprising a second layered active material, wherein:
      composition of the first layered active material is different from composition of the second layered active material,
      the one or more first substructures interface and are attached to the one or more second substructures, and
      each of the first layered active material and the second layered material is formed by components arranged into multiple repeated layers such that bonds between the components within each of these multiple repeated layers is different than bonds between two adjacent ones of the multiple repeated layers.

2. The hybrid active material structure of claim 1, wherein each of the first layered active material and the second layered active material comprises a common element.

3. The hybrid active material structure of claim 2, wherein the common element is selected from the group consisting of sulfur and oxygen.

4. The hybrid active material structure of claim 1, wherein one of the first layered active material or the second layered active material comprises a material selected from the group consisting of graphite, $WS_2$, $MoS_2$, BN, $V_2O_{5-x}$, $NiCl_2$, $NbS_2$, $ZrS_2$, $TiSi_2$, $MoSe_2$, $SnS_2$, $VS_2$, $HfS_2$, $WSe_2$, $TiO_2$, and $Li_4Ti_5O_{12}$, and $TiS_2$.

5. The hybrid active material structure of claim 1, wherein the first layered active material comprises graphite, and wherein the second layered active material comprises $TiSi_2$.

6. The hybrid active material structure of claim 1, wherein a weight ratio of the first layered active material in the hybrid active material structure is between about 0.5% and 99.5%.

7. The hybrid active material structure of claim 1, wherein the first layered active material of the one or more first substructures is chemically bonded to the second layered active material of the one or more second substructures.

8. The hybrid active material structure of claim 1, wherein the one or more second substructures form a shell, at least partially enclosing the one or more first substructures.

9. The hybrid active material structure of claim 8, wherein the shell formed by the one or more second substructures fully encloses the one or more first substructures.

10. The hybrid active material structure of claim 1, wherein the one or more first substructures and the one or more second substructures are arranged as alternating layers.

11. The hybrid active material structure of claim 10, wherein a thickness of each one of the alternating layers is between about 1 nanometer and 5 micrometers.

12. The hybrid active material structure of claim 1, wherein at least one of the first layered material or the second layered material has a shape of a particle, a wire, a tube, a net, a sheet, a flake, a needle, a sphere, a belt, a hollow structure, a core-shell, or a york-shell.

13. The hybrid active material structure of claim 1, wherein a surface of the hybrid active material structure is formed predominantly by the one or more first substructures.

14. The hybrid active material structure of claim 1, wherein a surface of the hybrid active material structure is formed entirely by the one or more first substructures.

15. The hybrid active material structure of claim 1, further comprising an external surface layer coating disposed over the one or more first substructures and the one or more second substructures and forming a surface of the hybrid active material structure.

16. The hybrid active material structure of claim 1, further comprising an interface layer disposed between the one or more first substructures and the one or more second substructures.

17. The hybrid active material structure of claim 1, wherein at least one of the one or more first substructures and the one or more second substructures comprises a dopant.

18. The hybrid active material structure of claim 1, wherein the hybrid active material structure is operable as an active material of the electrode, a conductive additive of the electrode, or both.

19. An electrochemical cell comprising:
   a first electrode, comprising a hybrid active material structure comprising:
      one or more first substructures, comprising a first layered active material; and
      one or more second substructures, comprising a second layered active material,
   wherein:
      composition of the first layered active material is different from composition of the second layered active material;

the one or more first substructures directly interface the one or more second substructures; and a surface of the hybrid active material structure is formed predominantly by the one or more first substructures, and each of the first layered active material and the second layered material is formed by components arranged into multiple repeated layers such that bonds between the components within each of these multiple repeated layers is different than bonds between two adjacent ones of the multiple repeated layers.

20. The electrochemical cell of claim 19, wherein one of the first layered active material or the second layered active material comprises a material selected from the group consisting of graphite, $WS_2$, $MoS_2$, BN, $V_2O_{5-x}$, $NiCl_2$, $NbS_2$, $ZrS_2$, $TiSi_2$, $MoSe_2$, $SnS_2$, $VS_2$, $HfS_2$, $WSe_2$, $TiO_2$, and $Li_4Ti_5O_{12}$, and $TiS_2$.

* * * * *